United States Patent [19]

Yasuda et al.

[11] Patent Number: 4,687,954
[45] Date of Patent: Aug. 18, 1987

[54] CMOS HYSTERESIS CIRCUIT WITH ENABLE SWITCH OR NATURAL TRANSISTOR

[75] Inventors: Hiroshi Yasuda, Tokyo; Kiyofumi Ochii; Fujio Masuoka, both of Yokohama, all of Japan

[73] Assignee: Kabushiki Kaisha Toshiba, Kawasaki, Japan

[21] Appl. No.: 708,508

[22] Filed: Mar. 5, 1985

[30] Foreign Application Priority Data

Mar. 6, 1984 [JP] Japan ................................. 59-42753
Mar. 6, 1984 [JP] Japan ................................. 59-42754
Mar. 31, 1984 [JP] Japan ................................. 59-63581

[51] Int. Cl.$^4$ ........................................... H03K 3/356
[52] U.S. Cl. .................................... 307/279; 307/290; 307/451; 307/475; 307/359
[58] Field of Search ................ 307/443, 451, 475, 358, 307/359, 579, 585, 279, 290, 291

[56] References Cited

U.S. PATENT DOCUMENTS 3,984,703 10/1976 Jorgensen ........................ 307/443 X
4,464,587 8/1984 Suzuki et al. .................... 307/451 X
4,563,594 1/1986 Koyama ........................... 307/443 X
4,570,091 2/1986 Yasuda et al. ................... 307/451 X
4,571,504 2/1986 Iwamoto et al. ................. 307/451 X
4,581,545 4/1986 Beale et al. ..................... 307/359 X
4,607,178 8/1986 Sugie et al. ..................... 307/200 B X Primary Examiner—Stanley D. Miller
Assistant Examiner—D. R. Hudspeth
Attorney, Agent, or Firm—Finnegan, Henderson, Farabow, Garrett and Dunner

[57] ABSTRACT

A transistor circuit with hysteresis operation, which is formed with a detector part and selector part. The detector part detects a change in the level of an input signal according to one of first and second threshold levels, and generates an output signal having a level corresponding to the input signal. The level of the input signal is changed between a first level and a second level which is lower than the first level. The first and second threshold levels fall within a range defined between the first and second levels. The selector part selects one of the first and second threshold levels in accordance with the level of the output signal, and applies the selected one threshold level to the detector part.

7 Claims, 25 Drawing Figures

CMOS HYSTERESIS CIRCUIT WITH ENABLE SWITCH OR NATURAL TRANSISTOR

BACKGROUND OF THE INVENTION

The present invention relates to a transistor circuit for a semiconductor device with hysteresis operation, which is insensitive to noises and suitable to a semiconductor LSI.

With a current trend toward higher integration of semiconductor LSI circuits, the power consumption in an LSI chip is increasing. This results in inviting various noises in the LSI circuit and causes erroneous operation.

FIG. 1 shows an address transition detector circuit for detecting the transition of an address signal. The reference symbol Ar denotes an address signal. The reference symbol CE denotes a chip enable signal set at "L" level in a standby mode in which the internal circuit operation is inhibited. The reference symbol $\overline{CE}$ denotes an inverted chip enable signal. The reference numeral 1 denotes a NOR gate consisting of MOS transistor 11 to 14. The reference numeral 2 denotes an inverter consisting of MOS transistors 15 and 16. The reference numeral 3 denotes a pulse generator (internal circuit) being formed with MOS transistors 20 to 49, which detects a change in the potential of an inputted voltage (at node a2) and generates an output pulse (at node a11) upon detecting such a change. The reference numeral 50 denotes a power supply terminal. In a normal operation mode, signal CE is at "H" level and signal $\overline{CE}$ is at "L" level.

FIG. 2 shows the waveform of respective signals appearing in the circuit of FIG. 1. At the time when the level of address signal Ar changes from "L" to "H", node a1 is at "H", node a2 is at "L", node a3 is at "H", node a4 is at "L", and node a7 is at "H". Since node a8 is pulled up by p-channel transistor 20, the level of node a8 is "H" so that node a9 is at "L" and node a10 is at "H". Then, a clocked gate 60 is closed and a clocked gate 61 is opened, thereby establishing a positive feedback loop between nodes a5 and a6 so as to stably hold the logical state.

When address signal Ar goes to "H", node a4 goes to "H" and n-channel transistor 22 is turned on. Since node a7 is initially set at "H" and transistor 24 is turned on with the "H" of node a7, the circuit of transistors 22, 24 and 25 is activated and node a8 goes to "L". Node a9 then goes to "H", node a10 goes to "L", and clocked gate 60 is opened. In this manner, the information of changed signal Ar is transmitted through the circuit path of FIG. 1, and node a7 goes to "L" so that transistor 24 is turned off. A discharge path of transistors 22, 24 and 25 is then cut off, and node a8 is pulled up to "H" again. Along with this, node a9 goes to "L", node a10 goes to "H", and clocked gate 60 is closed to complete the series of circuit operations. During this process, node a11 produces a pulse PX with a certain width.

When address signal Ar goes to "L", node a11 similarly generates another pulse PX.

The circuit of FIG. 1 detects the transition of address signal Ar (from "L" to "H" or vice versa) and generates at node a11 a pluse signal PX having a certain width. This circuit may be applied to a memory circuit of internally synchronized type or the like. In such a synchronous memory circuit, the change in an address signal is generally asynchronous. For this reason, every time the address signal changes, an inner pulse is generated to initialize the internal logical state of the circuit or generated to control the circuit operation.

The circuit of FIG. 1 is generally employed in an address input section of a memory circuit, and it controls the operation of the memory circuit by pulse PX obtained at node a11. Thus, to achieve an accurate operation, the pulse width and generation timing of pulses PX obtained at node a11 must be properly controlled, so that an accurate and stable operation of the circuit is guaranteed.

As described above, according to the FIG. 1 configuration, a change or transition in the input signal Ar is transmitted to the internal circuit 3 so that the address transition detector circuit is activated.

Assume that the potential of address signal Ar is substantially fixed at a prescribed constant level but it involves a slight potential change due to noises, etc. Such a slight potential change is not generally detected by input gate 1 and will not be transmitted to the internal circuit 3. However, if the level of signal Ar reaches a potential at which the gain or amplification factor of input gate 1 is high, said slight potential change in signal Ar is largely amplified by input gate 1, and the amplified potential change causes an erroneous detection. Namely, the pulse width, timing, etc. of pulses PX obtained by the erroneous detection are inaccurate, and the circuit cannot be operated in a normal manner.

The above description is made with reference to a case wherein signal Ar is subjected to noises. However, a similar situation may also arise when noises on a power supply line fluctuate the power supply potential for input gate 1. This is because, since the potential of an input signal is defined with respect to a power supply potential, a fluctuation in the power supply potential equivalently induces noises in the input signal. Especially, in a semiconductor LSI, a power or current consumption within the LSI chip becomes large in proportion to an increase in integration density. From this, a fluctuation in the potential of a power supply line cannot be disregarded in such an LSI. It is likely that such a situation will continue. In this manner, a conventional circuit as shown in FIG. 1 is liable to an erroneous operation due to noises or the like and a countermeasure to this problem to guarantee a stable operation has been desired.

SUMMARY OF THE INVENTION

It is accordingly a main object of the present invention to provide a transistor circuit for a semiconductor device with hysteresis operation, which is insensitive to noises.

Another object of the invention is to provide an address transition detector circuit which is substantially free from noises on an input signal and/or on a power supply line.

Still another object of the invention is to provide a Schmitt trigger circuit having a hyteresis characteristic, which is capable of reliably converting TTL levels into MOS levels.

Yet another object of the invention is to provide a method for manufacturing an integrated circuit having a hyteresis characteristic, which allows easy manufacture of transistors having different threshold voltages.

To achieve the above main object, a transistor circuit of the invention includes a combination of a level change detector (71, 72) and a threshold selector (73, 74).

The level change detector (71, 72) detects the level change in an input signal (Vin) according to a first or second threshold level (V1 or V2) and generates an output signal (Vout) corresponding to the input signal (Vin). The difference (V2−V1) between the first and second threshold levels is so selected that the level change detector does not respond to variations in the potential of the input signal (Vin) due to noises, etc. The level of the input signal (Vin) changes between a first level (H) and a second level (L) which is different from the first level (H). The first and second threshold levels (V1, V2) fall within a range defined between the first and second levels (H, L). The first threshold level (V1) is used for detecting a signal transition that the level of the input signal (Vin) changes from the first level (H) to the second level (L). The second threshold level (V2) is used for detecting a signal transition that the level of the input signal (Vin) changes from the second level (L) to the first level (H).

The threshold selector (73, 74) selects one of the first and second threshold levels (V1, V2). The threshold selector (73, 74) applies the second threshold level (V2) to the level change detector (71, 72) when the level of the output signal (Vout) represents the first level (H). On the other hand, when the level of the output signal (Vout) represents the second level (L), the threshold selector (73, 74) applies the first threshold level (V1) to the level change detector (71, 72).

To achieve said another object, the transistor circuit of the main object is applied to an input stage of an address transition detector circuit, thereby obtaining an address transition detector being substantially free from noises on an input signal and/or on a power supply line.

To achieve said still another object, the transistor circuit of the main object is applied to a Schmitt trigger circuit.

To achieve said yet another object, no shallow implantation in the step of NMOS transistor manufacture of a CMOS process is applied to a transistor having a relatively low threshold voltage. Thus, in a method for manufacturing a semiconductor integrated circuit which includes a Schmitt trigger circuit having a high threshold voltage transistor and a low threshold voltage transistor, a step of channel ion-implantation is selectively effected only for a region of the high threshold voltage transistor (in this step, a region of the low threshold voltage transistor is covered with a resist film), and the channel ion-implantation step is not applied to the region of the low threshold voltage transistor.

BRIEF DESCRIPTION OF THE DRAWINGS

FIG. 7 shows a waveform of an address signal Ar with potential variations due to noises or the like;

DETAILED DESCRIPTION OF THE PREFERRED EMBODIMENTS

Figure 1:
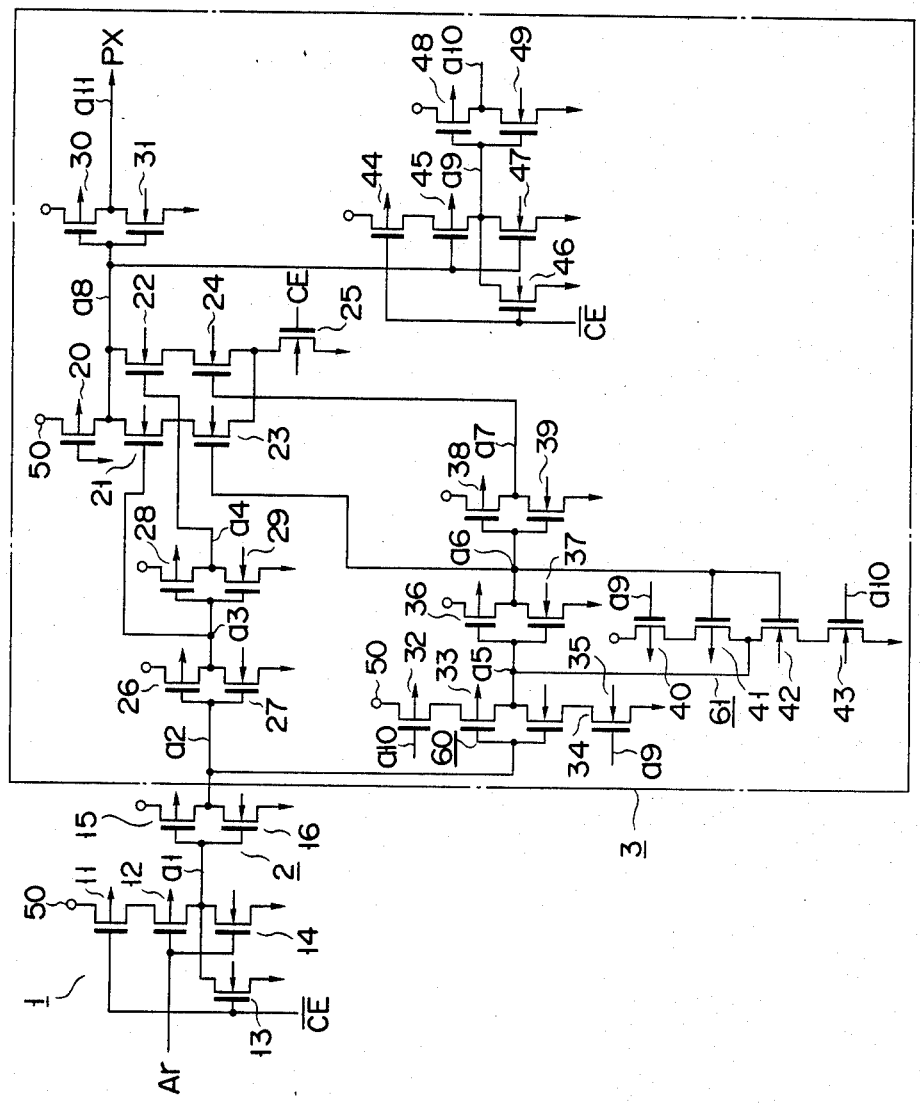
FIG. 1 shows a circuit configuration of an address transition detector circuit which is a background art of the invention.
Figure 2:
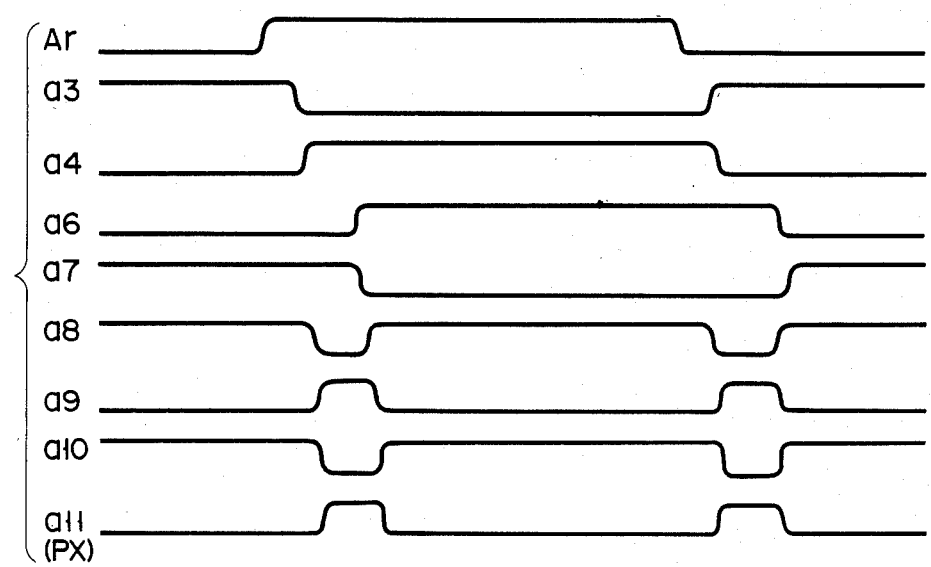
FIG. 2 is a timing chart illustrating the operation of the FIG. 1 circuit.

Hereinafter, preferred embodiments of the invention will be described in detail with reference to the accompanying drawings. In the following description, the same or similar elements are denoted by the same or similar reference numerals throughout the drawings, thereby avoiding redundant explanations.

Figure 3:
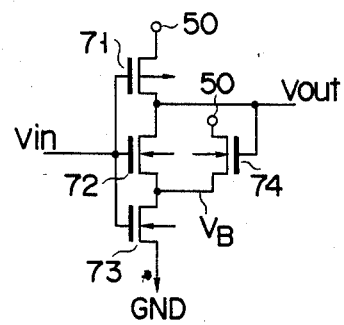
FIG. 3 is a circuit diagram of an inverter with hysteresis operation, which is an embodiment of the present invention.

FIG. 3 is a circuit diagram of an inverter with hysteresis operation, which is an embodiment of the present invention. The inverter of FIG. 3 includes a level change detector circuit (71, 72) and a threshold selector circuit (73, 74). The level change detector circuit is formed with a p-channel MOS transistor 71 and an n-channel MOS transistor 72. The source of transistor 71 is connected to a positive power supply terminal 50. The gate of transistor 71 receives an input signal Vin, and the drain thereof provides an output signal Vout which is anti-phasic to input signal Vin. The drain and gate of transistor 72 are connected to the drain and gate of transistor 71, respectively. The threshold selector circuit is formed with n-channel MOS transistors 73 and 74. The drain of transistor 73 is connected to the source of transistor 72, and the gate of transistor 73 receives input signal Vin. The source of transistor 73 is connected to a circuit-ground. The drain of transistor 74 is connected to power supply terminal 50, or it may be connected to any other proper positive potential line. The gate of transistor 74 receives output signal Vout, and the source thereof is connected to the drain of transistor 73.

Figure 4:
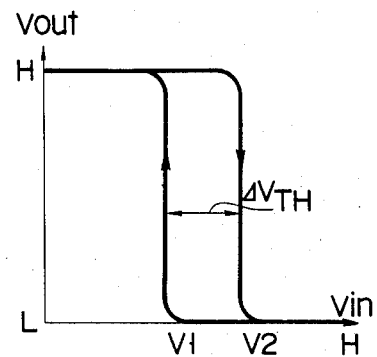
FIG. 4 is a graph showing the input/output characteristics of the inverter in FIG. 3.

The above inverter is a sort of a Schmitt trigger circuit and has a hysteresis characteristic as shown in FIG. 4.

The level change detector (71, 72) detects the level change in input signal Vin according to a first or second threshold level V1 or V2 and generates output signal Vout corresponding to input signal Vin. The difference (V2−V1, or ΔVTH) between the first and second threshold levels is so selected that the level change detector does not respond to variations in the potential of input signal Vin due to noises, etc. The level of input signal Vin changes between a first level "H" and a second level "L" which is different from level "H". First and second threshold levels V1, V2 fall within a range defined between first and second levels "H", "L". First threshold level V1 is used for detecting a signal transition that the level of input signal Vin changes from first level "H" to second level "L". Second threshold level V2 is used for detecting a signal transition that the level of input signal Vin changes from second level "L" to first level "H".

The threshold selector (73, 74) selects one of the first and second threshold levels V1, V2. The threshold selector (73, 74) applies the second threshold level V2 to the level change detector (71, 72) when the level of output signal Vout represents the first level "H". When the level of output signal Vout represents the second level "L", the threshold selector (73, 74) applies the first threshold level V1 to the level change detector (71, 72).

The circuit of FIG. 3 will operate as follows. Assume that, at an initial stage, the level of input signal Vin is "H" and the level of output signal Vout is "L" (71=OFF: 72, 73=ON). In this case, transistor 74 is in OFF state because Vout is "L". When the potential of Vin passes across a first threshold level V1 during the level change of Vin from "H" to "L", the potential of Vout abruptly rises at Vin=V1, as shown in FIG. 4. Threshold level V1 is determined by the power supply potential at terminal 50 and the threshold voltage of transistor 71. The inverter characteristic of the above abrupt potential rise at threshold level V1 depends on the ratio among conductances of transistors 71 to 73.

After completion of the above level change of signal Vin (from "H" to "L"), transistor 71 is ON and transistor 72 is OFF. In this case, signal Vout is "H" so that transistor 74 is ON. Then, a potential VB at the source of transistor 72 is enhanced via the turned-on transistor 74 by the "H" level of Vout. At this time, the threshold voltage of transistor 72 is enhanced according to a back-gate bias effect (or substrate bias effect) with the "H" level of VB, so that the input threshold level of the FIG. 3 inverter is increased to V2. From this, even if the potential of signal Vin exceeds the threshold level V1 due to noises, unless the peak potential of such signal Vin exceeds the increased threshold level V2, the output condition of Vout="H" is stably retained. Thus, the FIG. 3 inverter is insensitive to noises on input signal Vin.

Incidentally, according to the presently available CMOS technology, the back-gate bias effect obtained in an NMOS transistor is more prominent than than obtained in a PMOS transistor. This is the reason why n-channel transistors 72 to 74 are used in the FIG. 3 embodiment.

With an increase in the potential of signal Vin, the drain current of transistor 73 gradually increases so that potential VB at the source of transistor 72 gradually decreases. The decrease in potential VB renders the threshold voltage of transistor 72 equivalently low. When the potential difference between the gate and source of transistor 72 exceeds the threshold voltage of transistor 72, transistor 72 is turned on so that the potential of signal Vout falls. The potential fall of Vout lowers the transconductance of transistor 74, resulting in reducing the potential VB. The reduction in potential VB causes a potential reduction of Vout. Thus, a positive feedback (PFB) operation is effected through transistor 74. With this PFB operation, the potential of Vout decreases rapidly.

The potential of input signal Vin which triggers the above PFB operation is represented by V2 in FIG. 4. The threshold level V2 is higher than said threshold level V1 by ΔVTH. As seen from FIG. 4, the potential of output signal Vout changes in a different manner in accordance with the rising and falling of input signal Vin. Thus, the inverter of FIG. 3 has a hysteresis characteristic. The signal response of the FIG. 3 inverter has a dead zone ΔVTH with respect to the amplitude of input signal Vin. Because of the presence of such a dead zone, the FIG. 3 circuit is insensitive to noise components contained in signal Vin having amplitudes less than ΔVTH. When the FIG. 3 circuit is applied to the input gate 1 (FIG. 5) or the subsequent input stage 2 (FIG. 6) of an internal circuit 3, the internal circuit 3 will not be adversely affected by noises on signal Vin.

Figure 5:
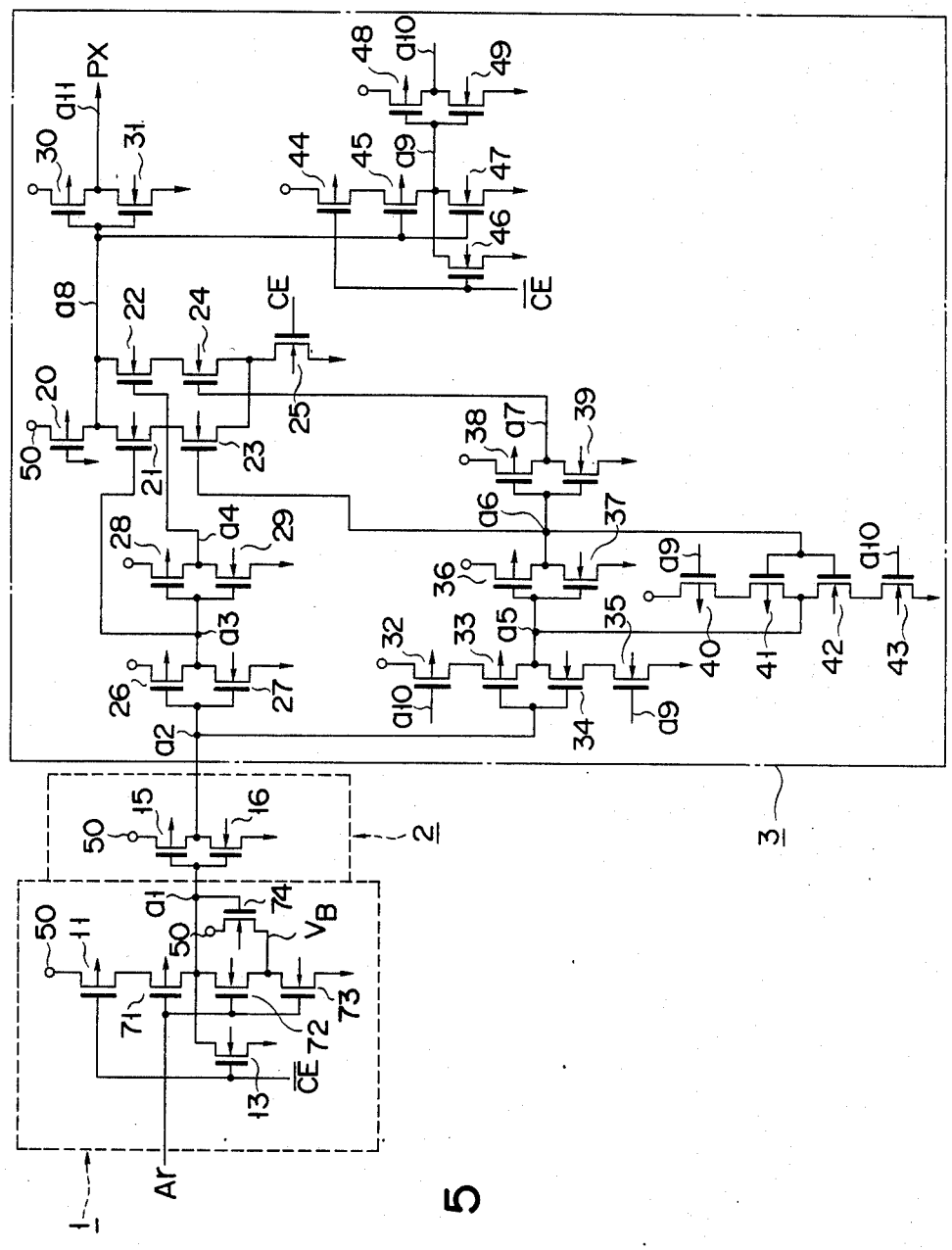
FIG. 5 shows a circuit configuration of an address transition detector circuit according to the present invention.

FIG. 5 shows a circuit configuration of an address transition detector according to the present invention. This circuit employs a hysteresis inverter of FIG. 3 at input gate 1. To avoid current consumption in a standby mode, input gate 1 is responsive to the logical NOR of signals $\overline{CE}$ and Ar. While the level of signal $\overline{CE}$ is "L", the configuration of transistors 71 to 74 functions as a Schmitt trigger circuit having a hysteresis characteristic as shown in FIG. 4. The hysteresis characteristic of input gate 1 serves to eliminate the adverse influence of noises on address signal Ar. (An example of noise on signal Ar or Vin is illustrated in FIG. 7 in which the period of the noise component is denoted by ΔT and the amplitude thereof is denoted by ΔV.)

Figure 6:
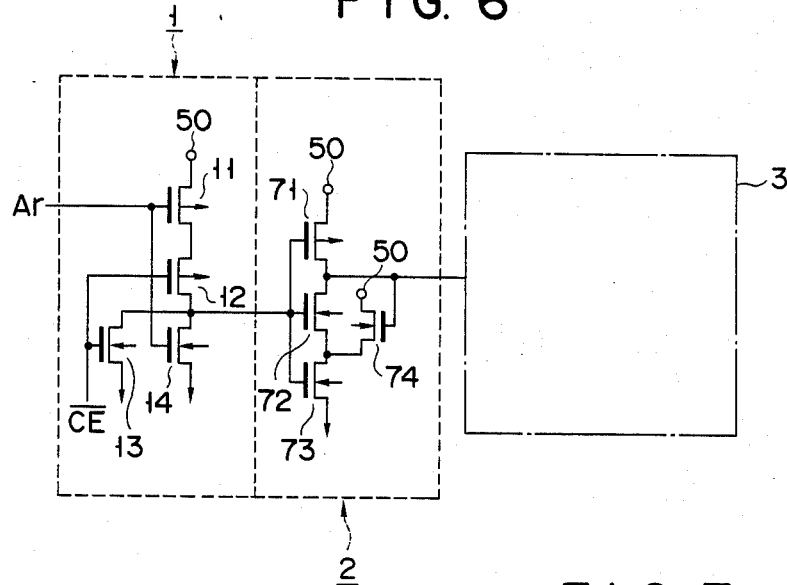
FIG. 6 shows another address transition detector circuit according to the present invention.

FIG. 6 shows another circuit configuration of an address transition detector according to the present invention. In the FIG. 6 circuit, an inverter 2 following to an input gate 1 has a circuit configuration of FIG. 3.

In a MOS input circuit, conversion from TTL (Transistor Transistor Logic) levels into MOS levels is generally required. According to the FIG. 6 circuit, such conversion is achieved at input gate 1, while noise-free operation is achieved at inverter 2 with a hysteresis characteristic as shown in FIG. 4. According to such a circuit configuration, the circuit design with respect to the TTL/MOS level conversion can be independent of the circuit design with respect to the hysteresis characteristic for eliminating the influence of noises.

Figure 7:

An examination was made to determine whether or not an address transition detector erroneously operates when address signal Ar is subjected to periodic noises having an amplitude ΔV and a period ΔT as shown in FIG. 7. Generally speaking, such a detector is liable to be erroneously operated if the noise period ΔT becomes long and/or the noise amplitude ΔV becomes large. From this, an erroneous operating region of the detector can be represented as a function of ΔT and ΔV.

Figure 8:
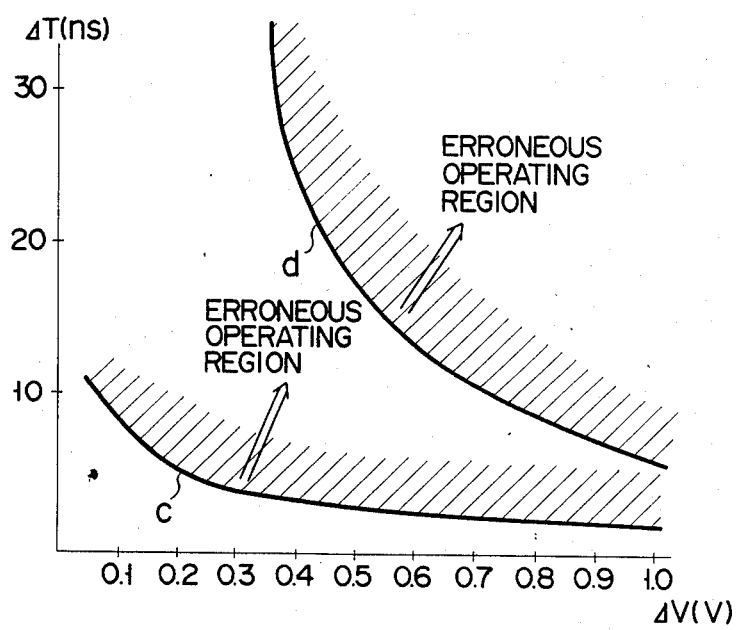
FIG. 8 is a graph illustrating erroneous operating regions of the background art circuit (FIG. 1) and of the circuit of the present invention (FIG. 5)

The result of the examination obtained by calculation is shown in FIG. 8. In FIG. 8, the boundary line c indicates the erroneous operating region of the background art detector (FIG. 1), and the boundary line d indicates the erroneous operating region of the detector according to the present invention (FIG. 5).

FIG. 8 teaches that a normally operating region (outer region of boundary d) obtained by the FIG. 5 detector is wider than that (outer region of boundary c) obtained by the FIG. 1 detector. Thus, in comparison with the background art (FIG. 1), the address transition detector of the invention (FIG. 5) is far more insensitive to the noise components on address signal Ar. This means that the internal circuit (address transition detector, etc.) is practically free from the influence of noises on an input signal (Ar or Vin) and/or on a power supply potential. (When the reference of potential is made on the power supply potential at terminal 50, the potential variations due to noises on the power supply potential equivalently induces potential variations on signal Ar. Thus, with respect to the operation of transistor 71, the influence of noises on signal Ar is substantially the same as that of noises on the power supply line.)

As seen from the above description, a noise-free address transition detector circuit with hysteresis operation is obtained by the present invention. This circuit provides an effective countermeasure against the problem of noises which is becoming more serious with higher integration density of semiconductor LSIs and larger capacities thereof.

Another embodiment of the present invention will be described with reference to FIGS. 9 to 12.

Figure 9:
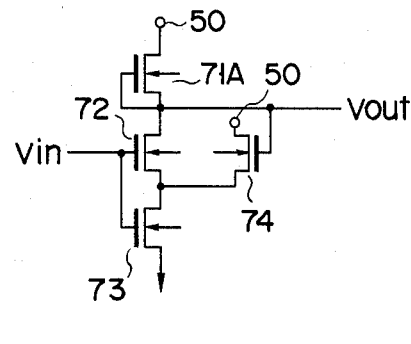
FIGS. 9 to 12 respectively show inverter circuits having hysteresis characteristics as shown in FIG. 4, each of which is another embodiment of the present invention.

FIG. 9 shows a modification of the FIG. 3 inverter circuit. In the FIG. 9 inverter, the drain of an n-channel MOS transistor 72 is coupled via an n-channel load MOS transistor 71A to power supply terminal 50.

Figure 10:
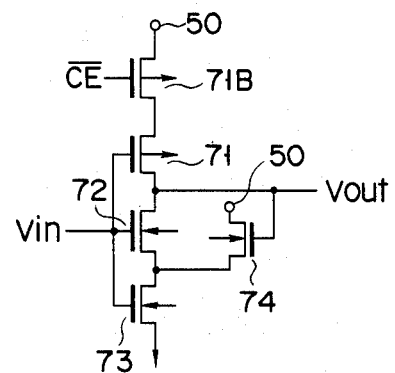

FIG. 10 shows another modification of the FIG. 3 inverter circuit. In the FIG. 10 inverter, the source of a p-channel MOS transistor 71 is connected to the drain of a p-channel MOS transistor 71B. The gate of transistor 71B receives an inverted chip enable signal $\overline{CE}$, and the source thereof is connected to power supply terminal 50.

Figure 11:
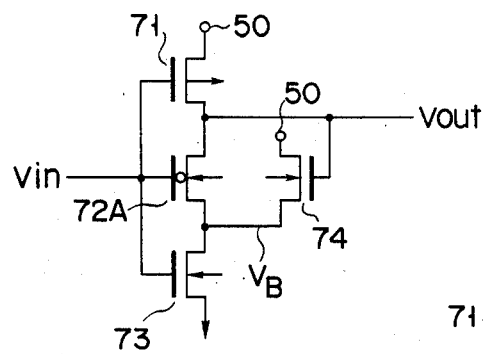

FIG. 11 shows still another modification of the FIG. 3 inverter circuit. In the FIG. 11 inverter, the drain of an n-channel MOS transistor 73 is connected to the source of an n-channel MOS transistor 72A. The gate of transistor 72A receives an input signal Vin, and the drain thereof is connected to the drain of a p-channel MOS transistor 71. In the FIG. 11 circuit, transistors 71, 73 and 74 are enhancement type, while transistor 72A is an I-type (intrinsic type). According to the FIG. 11 circuit, the property of I-type transistor 72A serves to decrease both threshold levels V1 and V2, while retaining the hysteresis characteristic as shown in FIG. 4. Practically, threshold levels V1, V2 of FIG. 11 inverter can be set at around 1.0 to 1.5 volts. Thus, a Schmitt trigger circuit with decreased threshold levels, which has a hysteresis characteristic and is capable of reliably converting TTL levels into MOS levels, is obtained by the configuration of FIG. 11.

During the manufacture of NMOS (n-channel MOS) transistors, an impurity of the same type as that of a substrate is doped in a channel region in order to obtain a prescribed threshold voltage. A low threshold voltage NMOS transistor can be obtained if such impurity doping is not effected. If a mask which selectively disturbs the impurity doping into transistor 72A is used during the impurity doping process, only the threshold voltage of transistor 72A can be made low without requiring a supplemental or additional manufacturing process. The threshold voltage of the Schmitt trigger circuit in FIG. 11 can be set low by the use of I-type transistor 72A having low threshold voltage. The circuit of FIG. 11 may be manufactured by a conventional semiconductor IC manufacturing process.

Figure 12:
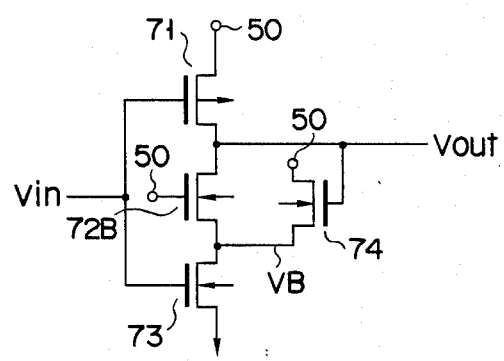

FIG. 12 shows yet another modification of the FIG. 3 inverter circuit. In the FIG. 12 inverter, the drain of an n-channel MOS transistor 73 is connected to the source of an n-channel MOS transistor 72B. The gate of transistor 72B is connected to a power supply terminal 50, and the drain thereof is connected to the drain of a p-channel MOS transistor 71. Since the gate of NMOS transistor 72B is highly biased with the positive power supply potential, the threshold levels V1, V2 of the Schmitt trigger circuit in FIG. 12 is substantially reduced. From this, the FIG. 12 circuit may have a characteristic suitable to convert TTL levels into MOS levels. Thus, while the FIG. 11 circuit embodies the TTL/MOS conversion characteristic by means of a semiconductor manufacturing process, the FIG. 12 circuit embodies the same by means of circuit connections.

According to the above embodiment of FIG. 11 or 12, the circuit threshold levels V1, V2 are not restricted to the threshold voltage of transistors in the circuit. Rather, the circuit threshold levels V1, V2 can be set optionally. Since the FIG. 11 or 12 circuit has a hysteresis characteristic which serves to eliminate the influence of noises, a noise-free transistor circuit having a function for converting TTL levels into MOS levels can be obtained.

Transistor 72 in the Schmitt trigger circuit of FIG. 3 preferably has a lower threshold voltage than the threshold voltage of other transistors in a memory, microprocessor, etc. When the threshold voltage of transistor 72 is set at around 0 V, even if a back-gate bias is effected, the upper limit of the threshold voltage of transistor 72 is up to about 1 V. From this, the input threshold levels (V1, V2) of the FIG. 3 Schmitt trigger circuit can be set at about 1.5 V. A method for manufacturing an integrated circuit including such a low threshold voltage transistor will be described with reference to the manufacturing process of transistors 72 and 73 in FIG. 3 (or transistors 72A and 73 in FIG. 11).

Figure 13A:
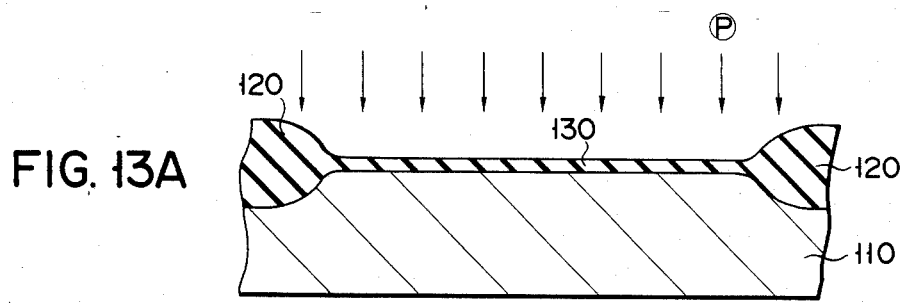
FIGS. 13A to 13D are sectional views explaining a method for manufacturing an integrated circuit according to the present invention.

FIGS. 13A to 13O are sectional views explaining a method for manufacturing the transistors 72 and 73 in FIG. 3 (or transistors 72A and 73 in FIG. 11).

Referring to FIG. 13A, gate oxidation is effected on the surface portion of a p-type semiconductor substrate 110 which is surrounded by a field oxide layer 120. A gate oxide film 130 with a predetermined thickness is thus formed. Subsequently, ions (generally boron) having the same conductivity type (p type) as that of substrate 110 are implanted by means of a deep implantation with an acceleration voltage of 100 keV and with a dose of $1.0 \times 10^{12}/cm^2$. When a high dose of an impurity is ion-implanted with a relatively high acceleration speed, the concentration at a deep portion of the channel in the substrate is increased, thereby preventing a leakage between the source and drain of a MOS transistor formed therein.

Figure 13B:
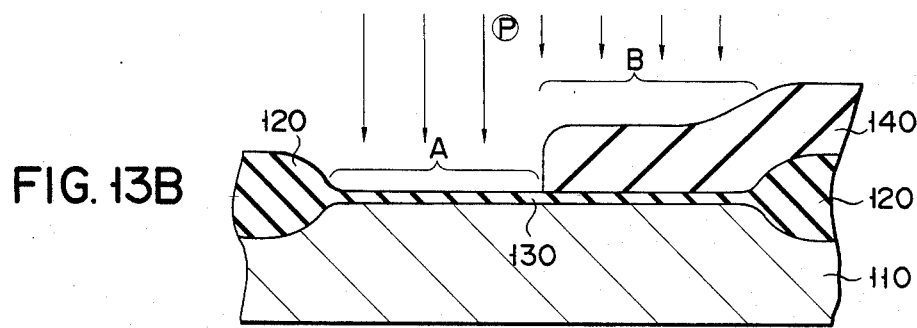

Next, as shown in FIG. 13B, shallow implantation is effected on a given surface region A of substrate 110, which is provided for an enhancement type NMOS transistor 73. That is, a region B for a low threshold voltage NMOS transistor 72 (or 72A) is covered with a resist 140. Subsequently, a p-type impurity such as boron is ion-implanted into region B with a relatively low acceleration voltage of, e.g., 40 keV and with a low dose of $2.0 \times 10^{11}/cm^2$. Then, the threshold voltage of NMOS transistor 72 (or 72A) at region B is set at about 0.8 V. After completion of this ion implantation, resist 140 is removed.

Figure 13C:
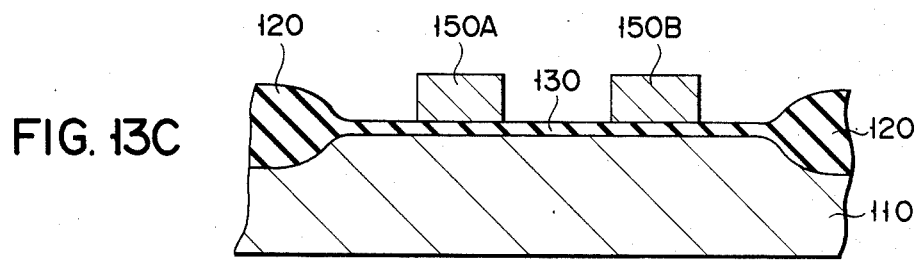

After resist 140 is removed, as shown in FIG. 13C, polycrystalline silicon layers (150A, 150B) are formed at prescribed positions on gate oxide film 130. These polycrystalline silicon layers are respectively patterned to form gate electrodes 150A and 150B of transistor 73 and 72 (or 72A).

Figure 13D:
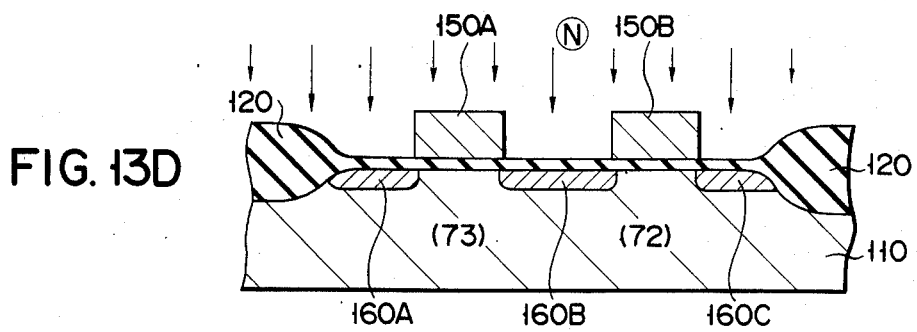

Thereafter, as shown in FIG. 13D, an n-type impurity such as arsenic is ion-implanted into the surface region of p-type substrate 110. At this time, each of gate electrodes 150A and 150B serves as a mask during the manufacturing process of diffusion layers 160A, 160B and 160C. Layer 160A serves as the source of transistor 73. Layer 160B serves as the drain of transistor 73 and as the source of transistor 72 (or 72A). Layer 160C serves as the drain of transistor 72 (or 72A). Then, the manufacturing process of transistors 72 and 73 in FIG. 3 (or transistors 72A and 73 in FIG. 11) is completed.

According to the above-mentioned IC manufacturing process, a totempole configuration of an enhancement type MOS transistor (73) with a relatively high threshold voltage and an intrinsic type MOS transistor (72 or 72A) with a low threshold voltage of about 0 V, is obtained.

Figure 14:
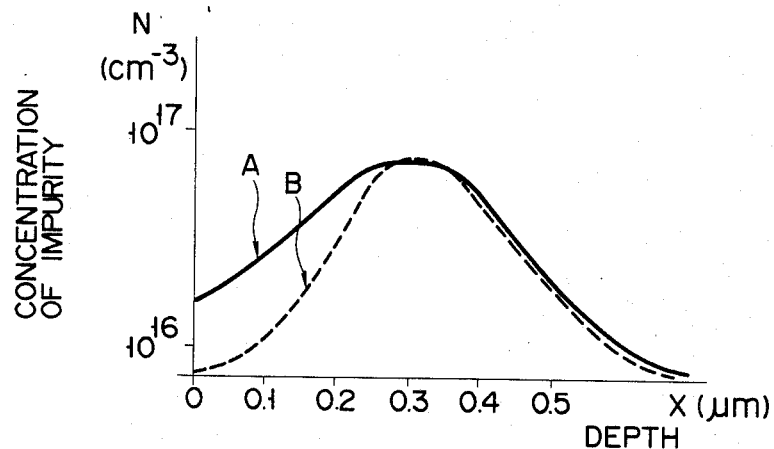
FIG. 14 is a graph showing the impurity profile in a channel region of MOS transistors illustrated in FIGS. 13A to 13D.

FIG. 14 shows an impurity profile (distribution) A of the channel region of relatively high threshold NMOS transistor 73 and an impurity profile B of the channel region of low threshold NMOS transistor 72 (or 72A) obtained by the manufacturing process of FIGS. 13A to 13D. As seen from the profile B in FIG. 14, the impurity concentration near the channel surface of the low threshold transistor (72 or 72A), on which no shallow implantation is effected, is almost zero. From this, channel inversion in the low threshold transistor (72 or 72A) is readily performed, thereby obtaining a zero threshold voltage. The impurity concentration at a deep portion in the channel of the low threshold transistor (72 or 72A) is the same as that of the high threshold transistor 73. For this reason, the leakage characteristic of the low threshold transistor (72 or 72A) is the same as that of the high threshold transistor 73.

According to the above-mentioned manufacturing process, except for the step of forming a resist film (140) on the region (B) for a prospective low threshold NMOS transistor (72 or 72A), the transistor circuit of the invention (FIGS. 3, etc.) can be simultaneously formed, together with a memory and/or microprocessor part, by means of conventional IC manufacturing technology. In addition, the resist film may be simply formed to cover the low threshold transistor region. Therefore, this resist film forming step does not require a high precision and is easy to perform.

In the above method, deep implantation into the MOS transistor region is performed first, and shallow implantation is performed next. However, this method may be modified as follows. Thus, shallow implantation into a high threshold transistor region is performed through a gate oxide film while the low threshold transistor region is covered with a resist film. Thereafter, the resist film is removed, and deep implantation into both the transistor regions is performed.

In this manner, according to the method of the present invention, a low threshold voltage transistor such as an intrinsic MOS transistor can be formed simultaneously with a relatively high threshold voltage enhancement MOS transistor, without requiring a complex procedure or a substantial modification of the manufacturing process. With this method, a Schmitt trigger circuit capable of effectively converting TTL level signals into MOS level signals can be manufactured by a conventional IC manufacturing technology. The present invention thus contributes to an improvement in performance of a large scale integrated circuit such as a memory or a microprocessor.

Figure 15:
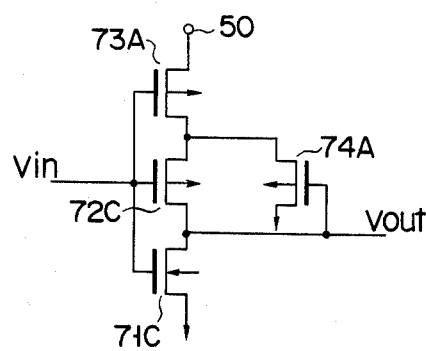
FIGS. 15 and 16 respectively show inverter circuits having hysteresis characteristics, each of which is still another embodiment of the present invention.
Figure 16:
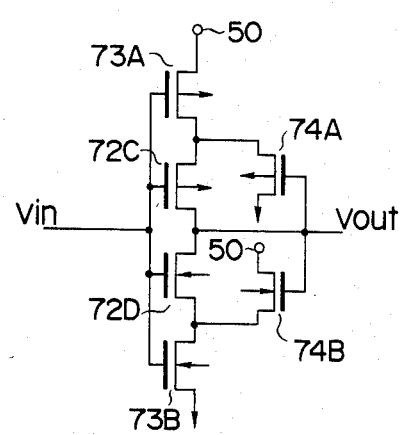

FIGS. 15 and 16 respectively show other inverter circuits of the invention, each having hysteresis characteristics as shown in FIG. 4.

According to the FIG. 15 configuration, a power supply terminal 50 is connected to the source of a p-channel MOS transistor 73A. The gate of transistor 73A receives an input signal Vin, and the drain thereof is connected to the source of a p-channel MOS transistor 72C. The gate of transistor 72C receives signal Vin, and the drain thereof is connected to the drain of an n-channel MOS transistor 71C. The gate of transistor 71C receives signal Vin, and the source thereof is connected to a circuit-ground. The drain of transistor 71C provides an output signal Vout. Signal Vout is applied to the gate of a p-channel MOS transistor 74A. The drain of transistor 74A is circuit-grounded, and the source thereof is connected to the drain of transistor 73A.

According to the FIG. 16 configuration, a power supply terminal 50 is connected to the source of a p-channel MOS transistor 73A. The gate of transistor 73A receives an input signal Vin, and the drain thereof is connected to the source of a p-channel MOS transistor 72C. The gate of transistor 72C receives signal Vin, and the drain thereof is connected to the drain of an n-channel MOS transistor 72D. The gate of transistor 72D receives signal Vin, and the source thereof is connected to the drain of an n-channel MOS transistor 73B. The gate of transistor 73B receives signal Vin, and the source thereof is circuit-grounded. The drains of transistors 72C and 72D provide an output signal Vout. Signal Vout is applied to the gate of a p-channel MOS transistor 74A. The drain of transistor 74A is circuit-grounded, and the source thereof is connected to the drain of transistor 73A. Similarly, signal Vout is applied to the gate of an n-channel MOS transistor 74B. The drain of transistor 74B is connected to power supply terminal 50, and the source thereof is connected to the drain of transistor 73B.

Figure 17:
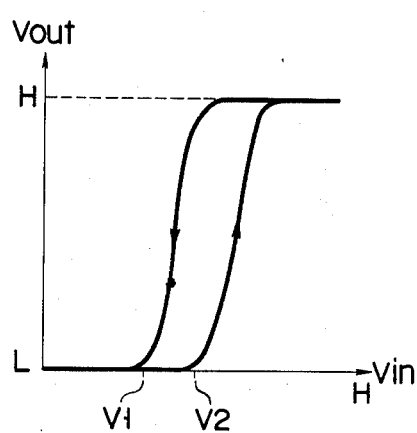
FIG. 17 is a graph showing the input/output characteristics of a noninverting buffer circuit according to the present invention.

FIG. 17 is a graph showing the input/output characteristics of a noninverting buffer circuit according to the present invention. The hysteresis characteristic as shown in FIG. 17 serves to eliminate the influence of noises on an input signal and/or on a power supply line. FIGS. 18 to 22 respectively show noninverting buffer circuit having hysteresis characteristics as shown in FIG. 17.

Figure 18:
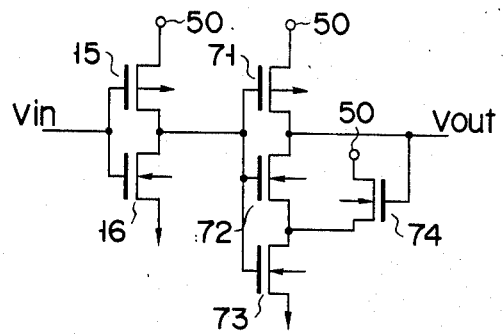
FIGS. 18 to 22 respectively show noninverting buffer circuits having hysteresis characteristics as shown in FIG. 17, each of which is yet another embodiment of the present invention.

The buffer circuit of FIG. 18 is a modification of the FIG. 3 inverter. Thus, in FIG. 18, a CMOS inverter of transistors 15 and 16 is provided at the input stage of a hysteresis inverter of transistors 71 to 74.

Figure 19:
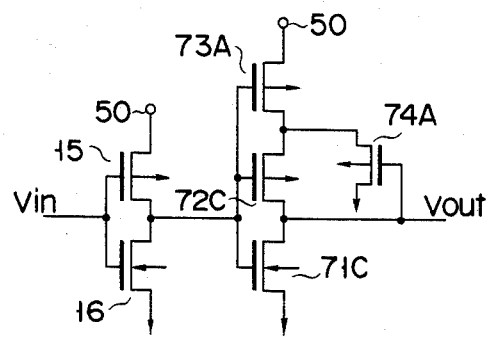

The buffer circuit of FIG. 19 is a modification of the FIG. 15 inverter. Thus, in FIG. 19, a CMOS inverter of transistors 15 and 16 is provided at the input stage of a hysteresis inverter of transistors 71C, 72C, 73A and 74A.

Figure 20:
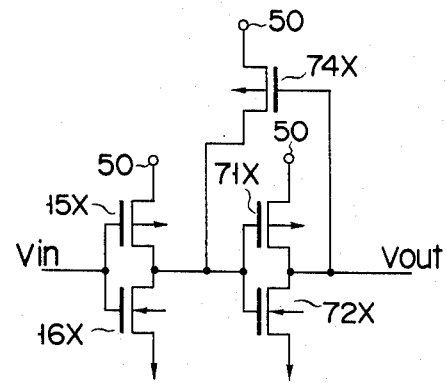

FIG. 20 is another embodiment of the invention. In the FIG. 20 configuration, the output circuit of a CMOS inverter 15X, 16X is connected to the input circuit of a following CMOS inverter 71X, 72X. An output signal Vout from inverter 71X, 72X is positively fed back to the input circuit thereof via the gate-drain path of a p-channel MOS transistor 74X. (On the other hand, according to FIG. 3 configuration, Vout is positively fed back to the source of 72 via 74.)

Figure 21:
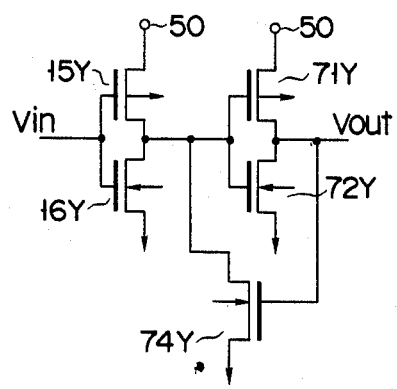

The buffer circuit of FIG. 21 is a modification of the FIG. 20 buffer. In the FIG. 21 configuration, the output circuit of a CMOS inverter 15Y, 16Y is connected to the input circuit of a following CMOS inverter 71Y, 72Y.

An output signal Vout from inverter 71Y, 72Y is positively fed back to the input circuit thereof via the gate-drain path of an n-channel MOS transistor 74Y.

Figure 22:
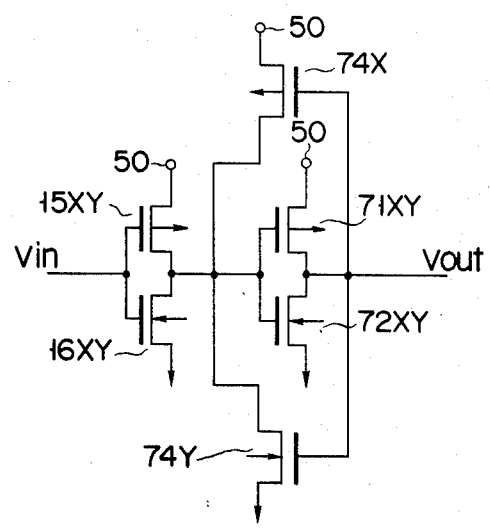

The buffer circuit of FIG. 22 is another modification of the FIG. 20 buffer. In the FIG. 22 configuration, the output circuit of a CMOS inverter 15XY, 16XY is connected to the input circuit of a following CMOS inverter 71XY, 72XY. An output signal Vout from inverter 71XY, 72XY is positively fed back to the input circuit thereof via the gate-drain path of a p-channel MOS transistor 74X and also via the gate-drain path of an n-channel MOS transistor 74Y.

The present invention should not be limited to the embodiments described in the specification or illustrated in the accompanied drawings. A skilled person in the art can readily modify the embodiment without departing from the scope of the invention.

We claim:

1. A transistor circuit for a semiconductor device with hysteresis operation, comprising:

first, second, and third power supply lines;

detector means for detecting a change in the level of an input signal according to one of a first threshold level and a second threshold level different from said first threshold level and for generating an output signal having a level corresponding to said input signal, the level of said input signal being changed between a first level and a second level that is different from said first level, and said first and second threshold levels falling within a range defined between said first and second levels, said detector means including a first transistor having a source coupled to said first power supply line, a gate coupled to receive said input signal, and a drain providing said output signal, and a second transistor having a drain coupled to said drain of said first transistor, a gate coupled to receive said input signal, and a source responsive to a given potential for determining which of said first and second threshold levels is to be applied to said detector means; and selector means coupled to said detector means for selecting one of said first and second threshold levels in accordance with the level of said output signal and applying the selected one threshold level to said detector means, said selector means including a third transistor having a drain coupled to said source of said second transistor, a gate coupled to receive said input signal, and a source coupled to said second power supply line, and a fourth transistor having a drain coupled to said third power supply line, a gate coupled to receive said output signal, and a source providing said given potential, said detector means further including a switch element coupled in series to said first, second, and third transistors and being responsive to a given signal, for cutting-off a current path formed between said first power supply line and one of said second or third power supply lines in accordance with the logical level of said given signal.

2. A transistor circuit according to claim 1, wherein said first to fourth transistors are enhancement MOS transistors.

3. A transistor circuit for a semiconductor device with hysteresis operation, comprising:

first, second, and third power supply lines;

detector means for detecting a change in the level of an input signal according to one of a first threshold level and a second threshold level different from said first threshold level and for generating an output signal having a level corresponding to said input signal, the level of said input signal being changed between a first level and a second level that is different from said first level, and said first and second threshold levels falling within a range defined between said first and second levels, said detector means including a first transistor having a source coupled to said first power supply line, a gate coupled to receive said input signal, and a drain providing said output signal, a second transistor having a drain coupled to said drain of said first transistor, a gate coupled to receive said input signal, and a source responsive to a given potential for determining which of said first and second threshold levels is to be applied to said detector means; and selector means coupled to said detector means for selecting one of said first and second threshold levels in accordance with the level of said output signal and applying the selected one threshold level to said detector means, said selector means including a third transistor having a drain coupled to said source of said second transistor, a gate coupled to receive said input signal, and a source coupled to said second power supply line, and a fourth transistor having a drain coupled to said third power supply line, a gate coupled to receive said output signal, and a source providing said given potential wherein said first, third, and fourth transistors are enhancement MOS transistors, and said second transistor is an intrinsic MOS transistor having a gate threshold voltage that is substantially zero.

4. A transistor circuit according to claim 3, further including means for receiving TTL level input signals and means for generating MOS logic level output signals in response thereto.

5. A transistor circuit for a semiconductor device with hysteresis operation:

first, second and third power supply lines;

detector means for detecting a change in the level of an input signal according to one of a first threshold level and a second threshold level different from said first threshold level and for generating an output signal having a level corresponding to said input signal, the level of said input signal being changed between a first level and a second level that is different from said first level, said first and second threshold levels falling within a range defined between said first and second levels, said detector means including;

a first transistor having a source coupled to said first power supply line, a gate coupled to receive said input signal, and a drain providing said output signal, and a second transistor having a drain coupled to said drain of said first transistor, a gate coupled to receive a given bias potential, and a source responsive to a given potential for determining which of said first and second threshold levels is applied to said detector means; and selector means coupled to said detector means for selecting one of said first and second threshold levels in accordance with the level of said output signal and applying the selected one threshold level to said detector means, said selector means including;

a third transistor having a drain coupled to said source of said second transistor, a gate coupled to receive said input signal, and a source coupled to said second power supply line, and a fourth transistor having a drain coupled to said third power supply line, a gate responsive to said output signal, and a source providing said given potential.

6. A transistor circuit according to claim 5, wherein said first to fourth transistor are enhancement MOS transistors.

7. A transistor circuit according to claim 3, further including means for receiving TTL level input signals and means for generating MOS logic level output signals in response thereto.

* * * * *